(12) United States Patent
Recker et al.

(10) Patent No.: US 7,171,346 B1
(45) Date of Patent: Jan. 30, 2007

(54) MISMATCH MODELING TOOL

(75) Inventors: Cynthia L. Recker, Mesa, AZ (US);
Patrick G. Drennan, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 708 days.

(21) Appl. No.: 09/654,253

(22) Filed: Sep. 1, 2000

(51) Int. Cl.
*G06F 17/50* (2006.01)
(52) U.S. Cl. ............................. 703/14; 703/13; 703/22; 716/4; 716/18
(58) Field of Classification Search .................. 703/13, 703/14, 16, 17, 22; 326/68; 364/578; 716/4, 716/18
See application file for complete search history.

(56) References Cited

U.S. PATENT DOCUMENTS

| 5,826,269 A | * | 10/1998 | Hussey ......................... 707/10 |
| 5,867,399 A | * | 2/1999 | Rostoker et al. ............ 354/489 |
| 6,397,117 B1 | * | 5/2002 | Burrows et al. .............. 700/97 |
| 6,560,755 B1 | * | 5/2003 | Zhang et al. .................. 716/4 |

OTHER PUBLICATIONS

Colin. C. McAndrew, "Practical Modeling for Circuit Simulation", Mar. 1998, IEEE Jpurnal of Solid-State Circuits, vol. 33, No. 3, pp. 439-448.*
Colin. C. Mcandrew, "Compact Device Modeling for Circuit Simulation", 1997, IEEE Custom Intergrated Circuit Conference, p. 151-158.*
Marcel J.M. Pelgrom, Hans P. Tuinhout and Maarten Vertregt, "Transistor matching in analog CMOS applications" Dec. 1998, IEDM 1998 Technical Digest International Dec. 6-9, 1998 p. 915-918.*
Colin C. McAndrew, Patrick Drennan, William F. Davis and Richard Ida, "Automated Generation of SPICE Characterization Test Masks and Test Databases", Proc. IEEE Int. Conf. On Microelectronics Test Structure vol. 12, Mar. 1999, pp. 74-79.*
Teresa Serrano-Gotarredona and Bemabe Linares-Barranco, "A New Five-Parameter MOS Transistor Mismatch Model", IEEE Electron device Letters, vol. 21, No. 1, Jan. 2000, pp. 37-39.*
"E-mail at work" Special Report/Electronic Mail, IEEE Spectrum, Oct. 1992, pp. 24-28.*
Four Pages Printed From Webopedia (date unknown) Discloses Common Meaning of "Frames".*
Michael et al., "Statistical Modeling of Device Mismatch for Analog MOS Integrated Circuits", IEEE Journal of Solid-State Circuits, vol. 27, Issue 2, Feb. 1992, pp. 154-166.*
P. Drennan, "Integrated Circuit Device Mismatch Modeling and Characterization for Alalog Circuits Design"—Ph.D. dissertation, Arizona State University, May 1999, 227 pages.
P. Drennan et al., "A Comprehensive MOSFET Mismatch Model", IEEE ICMS, Mar. 1999.

* cited by examiner

*Primary Examiner*—Kamini Shah
*Assistant Examiner*—Herng-der Day
(74) *Attorney, Agent, or Firm*—Charles W. Bethards

(57) ABSTRACT

A mismatch modeling tool (10) comprises a software implemented mismatch model (32). The software implemented mismatch model (32) accesses: at least one editable mismatch model data library (18) comprising process parameter variables, and circuit simulation library and program (14) data output. An interface screen (100) provides input and output coupling between a user and the software implemented mismatch model (32).

19 Claims, 9 Drawing Sheets

MISMATCH RESULTS

| W= 2 | Vd= 2.5 | X-Cpl= OFF |
|---|---|---|
| L= 2 | Vg= 1 | CTC= 0.0000 |
|  | Vb= 0 | Sigma= 1 |
|  |  | Temp= 27 |

|  | Id MM (+/-) | Vg MM (+/-) mV |
|---|---|---|
| Total | 2.7823% | 4.9071mV |
| dl | 0.0294 | 0.0442 |
| dwox | 0.0091 | 0.0193 |
| gox | 0.2070 | 0.4081 |
| nsub | 0.0118 | 0.0236 |
| rsh | 0.0000 | 0.0000 |
| ubref | 0.3572 | 0.7159 |
| vfb | 2.6715 | 4.7872 |
| vtl | 0.0026 | 0.0044 |
| vtw | 0.3956 | 0.6924 |

MISMATCH NOTES
Mismatch model based on Lot MB19168, wafer7 from CISD

MISMATCH CALCULATOR DATA ENTRY smos7lv □    MOS □    nlv □    Voltage Driven □

Create Data Entry Form    View Related Plots

Model= smos7lv_sps_tsg.udlib.rev0b

Calculate    Reset    email address: xxxxx

|  | Single | -OR- String | -OR- Range From | To | Steps |
|---|---|---|---|---|---|
| Vd: (V) | xxx | xxxxx | xxx | xxx | xxx |
| Vg: (V) | xxx | xxxxx | xxx | xxx | xxx |
| Vb: (V) | xxx | xxxxx | xxx | xxx | xxx |
| W: (cdr) | xxx | xxxxx | xxx | xxx | xxx |
| L: (cdr) | xxx | xxxxx | xxx | xxx | xxx |
| Temp (C): | xxx |  |  |  |  |

Cross Coupled? □    Center-to-Center [xxx]    Sigmas(#) [xxx]
☒ Show Mismatch Process Parameter Contributions
☒ Show Capacitances and Conductances
☒ Show Vdsat at [xx] dB drop from peak Rout: Step Size= [xx] V

FIG. 2

Model= smos7lv_sps_tsg.udlib.rev0b

[Calculate] [Reset]  email address: [×××××]
   122      124  126           128                    138

|  | Single | -OR- String | -OR- From | Range To | Steps |
|---|---|---|---|---|---|
| Vd: (V) | ××× | ××××× | ××× | ××× | ××× |
| Vg: (V) | ××× | ××××× | ××× | ××× | ××× |
| Vb: (V) | ××× | ××××× | ××× | ××× | ××× |
| W: (cdr) | ××× | ××××× | ××× | ××× | ××× |
| L: (cdr) | ××× | ××××× | ××× | ××× | ××× |
| Temp (C): | ××× | ××××× | ××× | ××× | ××× |

132 {

134 { Cross Coupled? ☐  Center-to-Center [×××]  Sigmas(#) [×××]

136 {
☒ Show Mismatch Process Parameter Contributions
☐ Show Capacitances and Conductances
☐ Show Vdsat at [××] dB drop from peak Rout: Step Size= [××] V

MISMATCH RESULTS

| W= 4 | Iref= 1e−5 | X-Cpl= OFF |
|---|---|---|
| L= 4 | Vd= 1.1 | CTC= 4.8000 |
| NP1= 1 | Vb= 0 | Sigma= 1 |
| NP2= 1 | | Temp= 27 |

| | Total MM (+/−) | w/o go on M2 (+/−) |
|---|---|---|
| Total | 3.7633% | 3.7461% |
| dl | 0.0330 | 0.0326 |
| dwox | 0.1597 | 0.1598 |
| gox | 0.1669 | 0.1680 |
| nl | 0.1314 | 0.1298 |
| rsh | 0.0039 | 0.0038 |
| ubref | 0.2974 | 0.2966 |
| vfb | 1.7248 | 1.7209 |
| vtl | 3.3207 | 3.3131 |

Iref= 1e−5 amp
Nominal Id= 1.09647e−05 amp
Nom_Id/Iref= 1.0965
Nominal Vg= 0.326625 v

MISMATCH CALCULATOR DATA ENTRY 114 cdrlbc ☐  RES ☐  rp2nsd ☐

Figure 8:
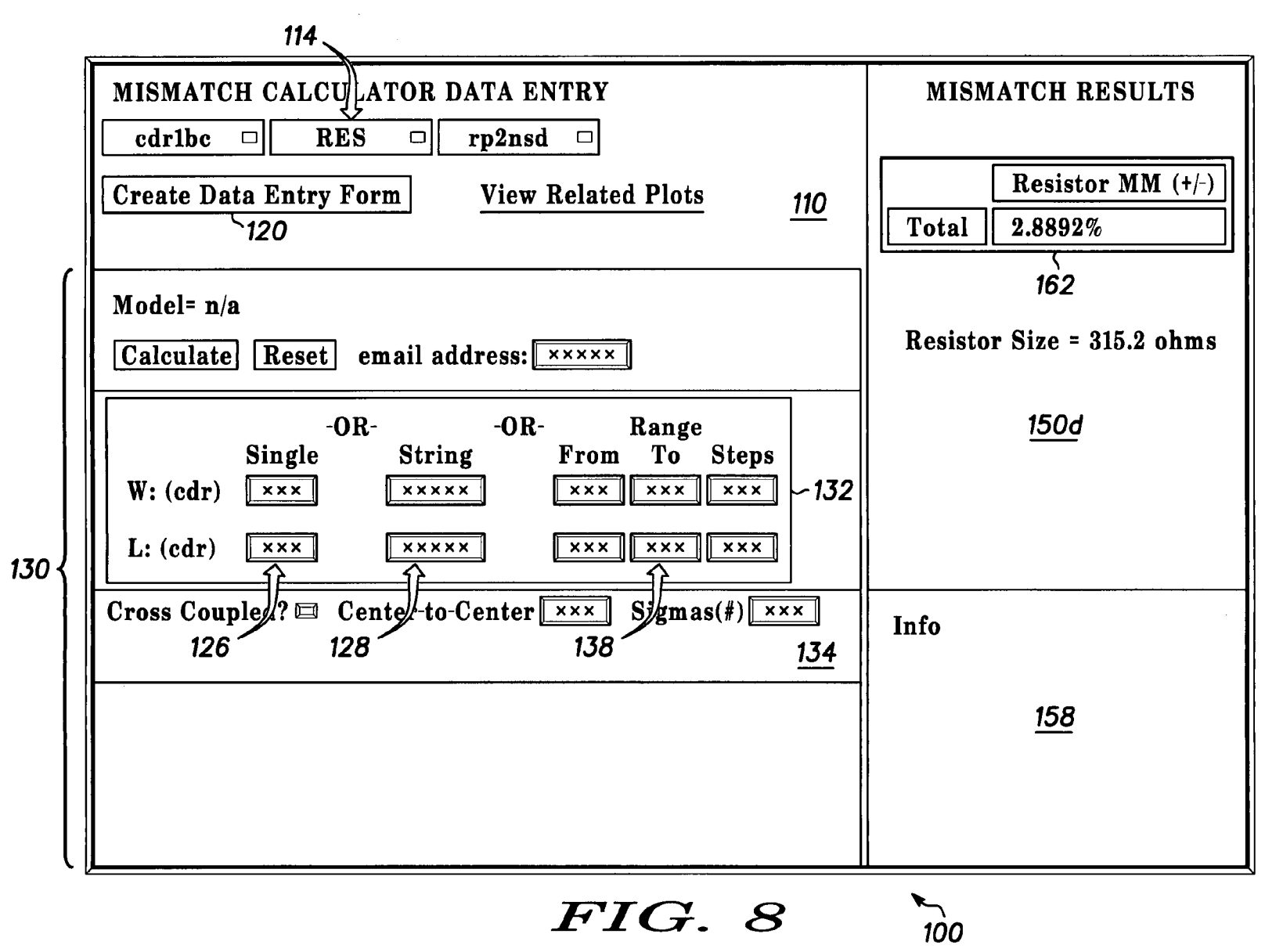

Create Data Entry Form    View Related Plots  110

120

Model= n/a

[Calculate] [Reset]  email address: [xxxxx]

|  | Single | -OR- | String | -OR- | Range From | To | Steps |
|---|---|---|---|---|---|---|---|
| W: (cdr) | xxx | | xxxxx | | xxx | xxx | xxx |
| L: (cdr) | xxx | | xxxxx | | xxx | xxx | xxx |

132

Cross Couple? ☐ = Center-to-Center [xxx] 138

126  128

Sigmas(#) [xxx] 134

MISMATCH RESULTS

| | Resistor MM (+/-) |
|---|---|
| Total | 2.8892% |

162

Resistor Size = 315.2 ohms

150d

Info  158

MISMATCH CALCULATOR DATA ENTRY cdr1bc ☐   RES ☐   cmim ☐

Create Data Entry Form — View Related Plots   110

— 114
 120

Model= n/a

Calculate   Reset   email address: [xxxxx]

|  | Single | -OR- | String | -OR- | Range From To Steps |
|---|---|---|---|---|---|
| W: (cdr) | [xxx] |  | [xxxxx] |  | [xxx] [xxx] [xxx] |
| L: (cdr) | [xxx] |  | [xxxxx] |  | [xxx] [xxx] [xxx] |

132

Cross Couple? ☐  Center-to-Center [xxx]   Sigmas(#) [xxx]
 126            128                138              134

130

MISMATCH RESULTS

| Capacitor MM (+/-) |
|---|
| Total | 0.0416% |

162

Capacitor Size= 129.6pF

150e

Info

MISMATCH MODELING TOOL

RELATED APPLICATIONS

This application is related to co-pending U.S. patent application Ser. No. 09/654,946 titled OPTIMIZATION TOOL by Recker et al. filed on Sep. 1, 2000. The co-pending application is assigned to the same assignee as here.

FIELD OF THE INVENTION

This invention relates to mismatch models, and more particularly, to a mismatch calculator tool for predicting transistor, resistor and capacitor mismatch resulting from various conditions.

BACKGROUND OF THE INVENTION

Mismatch is a leading cause of yield loss and a determining factor of circuit performance in analog, mixed-signal (AMS) ICs. A new method of modeling mismatch that accounts for variations in physical process parameters and is accurate over geometry and bias has been developed. However, as with prior mismatch models, the use of this new mismatch model required intensive manual calculations thus making it non-user friendly. Therefore, the application of the new mismatch methodology, or model, has been combined with computer programming and electronic circuit simulation and modeling resulting in a mismatch tool. Thus, users of the mismatch tool, such as designers and other engineering professionals, can create more robust designs by quickly evaluating the mismatch opportunity in a fraction of the time that the manual calculations required and with more accuracy. The mismatch tool further allows the designer to simulate a variety of bias and geometry conditions in a matter of seconds, including providing batch-mode capability to perform multiple sweeps over bias and geometry to aid in finding a desired configuration.

BRIEF DESCRIPTION OF THE DRAWINGS

FIG. 2 is an example of an interface to the mismatch modeling tool in an embodiment of the present invention;

FIG. 3 is a data entry input frame of the interface shown in FIG. 2;

FIG. 8 is the interface screen of FIG. 2 showing the data entry input frame and mismatch results output frame for a resistor mismatch calculation scenario;

FIG. 9 is the interface screen of FIG. 2 showing the data entry input frame and mismatch results output frame for a capacitor mismatch calculation scenario.

DETAILED DESCRIPTION OF THE DRAWINGS

Figure 1:
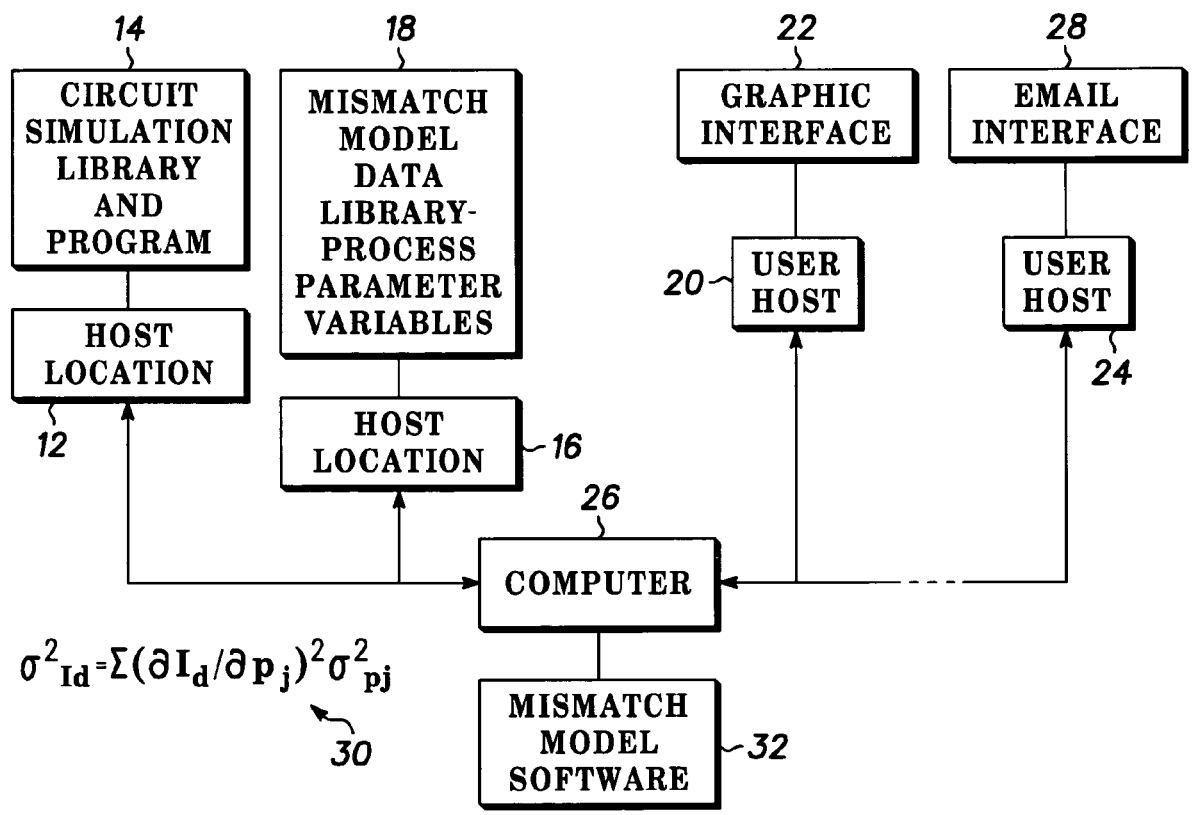
FIG. 1 is a simplified functional block diagram of the mismatch modeling tool in an embodiment in accordance with the present invention.

Referring to FIG. 1, a simplified functional block diagram of a mismatch modeling-tool 10 in an embodiment in accordance with the present invention is shown (the "mismatch tool 10" hereinafter). The mismatch tool 10 comprises the mismatch model $\sigma^2_{Id}=\Sigma(\partial I_d/\partial pj)^2\sigma^2_{pj}$ ("mismatch model 30" hereinafter); where Id is drain current (for field effect devices and collector current for bipolar junction devices), and pj is the jth physical process parameter. The mismatch model 30 predicts the statistical variance in the output current for any size transistor over terminal bias conditions. For field effect transistors, pj may contain known parameters such as the threshold voltage, $V_t$, the flatband voltage, $V_{fb}$, the gate oxide thickness, $T_{ox}$, offsets in length, L, and width, W, geometries, mobility, $\mu_0$, dopant concentrations and resistances. Implicit in the mismatch model 30 is the local variation description which states that $\sigma^2_{pj}$ scales inversely with geometry. The derivation and explanation of the mismatch model 30 is contained within the paper *A Comprehensive MOSFET Mismatch Model* by P. Drennan and C. Andrew, IEEE IEDM, 1999 ("Drennan et al." hereinafter), which the reader is referred to for additional detail regarding this particular mismatch model. Further explanation of the model is contained within *Integrated Circuit Device Mismatch Modeling and Characterization for Analog Circuit Design*,—Ph. D. dissertation, Arizona State University, May 1999, by P. Drennan ("Drennan" hereinafter). For bipolar junction transistor, pj may contain known parameters such as the ideal component of the base current, the pinched base sheet resistance, emitter and base resistances, and the space-charge-region recombination density.

Referring again to FIG. 1, the mismatch tool 10 further comprises the mismatch model software 32, which is run upon a computer, or server, 26. The computer 26 is electronically connected to a circuit simulation library and program 14. The circuit simulation library and program 14 may be comprised of any of the many electronic circuit modeling and simulation packages available. Some examples include the SPICE program developed by the University of California —Berkeley, but may also include PSPICE, MCSPICE, Saber, SmartSpice, etc. The circuit simulation library and program 14 is stored, and may be executed, at a host location 12. The host location 12 may be integral to the computer 26, or may also represent an unrelated computer or storage location. The mismatch tool 10 further comprises mismatch model data libraries 18, stored within a host location 16. The mismatch model data libraries 18 comprise process parameter variables used within the model 30 to account for the physical parameters affecting mismatch. As in the previous case, the host location 16 may be storage within, or part of, the computer 26, or may also represent an unrelated computer or storage location.

The mismatch tool 10 further comprises the data input and data output interfaces that may be comprised of any data interface method or system. In one embodiment, a web based application is utilized. A web based application is an application that is downloaded from a computer network each time the application is run. The computer network may be either an in-house local area network, or intranet, or a large scale wide area network, or internet. The advantage is that the application can be run from any computer, either on a local area network or via a wide area network such as the world wide web, and the software is routinely upgraded and maintained by the hosting organization rather than each individual user. Additionally, the web based applications are not limited to conventional web browser applications such as Netscape. Other web based application systems or programs may be employed within the web based application concept without departing from the spirit or scope of the present invention.

In an embodiment of the present invention, a graphical interface 22 is presented preferably upon a user host 20. The user host 20 may be a standalone computer, a time shared computer terminal, etc. Furthermore, an email interface 28 may also preferably reside upon a user host 24, which again may be a standalone computer, a time shared computer terminal, etc. The use of an email interface 28 upon a separate host 24, connected electronically to the computer 26, allows remote users to submit and receive data from locations remote from the computer 26, including globally. The automated combination of the mismatch model 30, the mismatch model software 32, the circuit simulation library and program 14, and the mismatch model data libraries 18, gives users a significant advantage in achieving reduced cycle time for design and improved product quality through more robust designs.

The mismatch tool 10 in an embodiment of the present invention further comprises a plurality of different calculation scenarios: a Voltage Driven scenario, a Current Mirror scenario, and a Differential Pair scenario, for MOSFET and BJT transistor devices; and a resistor calculation scenario and capacitor calculation scenario. Each of these calculation scenarios can be combined with calculations for other analog design objectives. Those skilled in the art will recognize that additional calculation scenarios other than these five are possible, and are also within the spirit and scope of the present invention. The five scenarios above are presented as examples of scenarios popular with those skilled in the art.

Referring to FIG. 2, an example of an interface to the mismatch tool 10 in an embodiment of the present invention is shown. The interface screen 100 comprises three major areas, or frames, in an embodiment of the present invention. The frames of the interface screen 100 comprise a calculation setup frame 110, a data input frame 130, and a data output frame 150. The data output frame 150 also comprises a message frame 158.

The frames of the interface screen 100 provide a user with the means to input data and receive returned output data in a graphical user friendly format. The user is guided through a sequence of pulldown menus within the calculation setup frame 110, wherein the user is presented with a technology selection 112, a device type selection 114, a subtype selection 116 and a calculation type selection 118. Each of the pulldown menus is actively generated, using programming languages such as JavaScript, Perl, etc., based upon the preceding menu selections.

As new technologies are developed and added into an embodiment of the present invention, the programming and database libraries are modified to include data files comprising the added technology name along with its shrink factor and design unit information. These programming modifications make the technology available on the pull down menus in the calculation setup frame 110. Additionally, a technology directory (not shown herein) is also created that comprises the device types available for analysis. Included in this technology directory is an electronic circuit/component model file for insertion into the circuit simulation library and program 14 that is used for the simulations along with files of measured data to be used in the calculation for the variance and gradient terms, and new model data to be added into the mismatch model data libraries 18. The aforementioned programming changes may be accomplished in a variety of methods by those skilled in the art.

Figure 7:
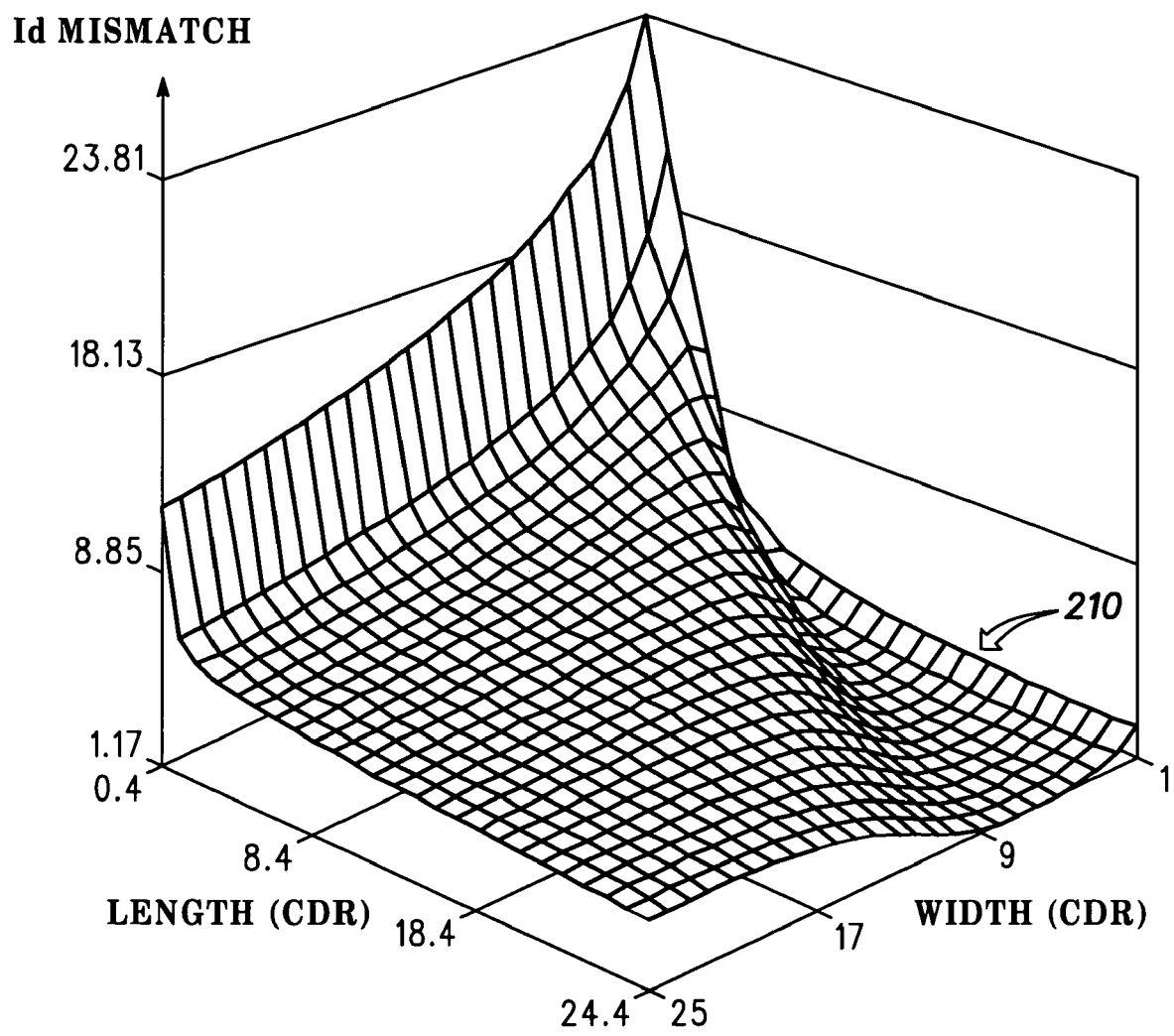
FIG. 7 shows an example of a mismatch results three dimensional output plot showing a sweet spot in a plot of Id versus geometry for an nmos current mirror.

The calculation setup frame 110 further comprises a View Related Plots 121 button, or link, that will launch a second graphical displaying a page that contains mismatch measured data, playback plots, and 3D and contour plots of the device mismatch over geometry, such as the 3D plot of Current Mirror mismatch versus geometry in FIG. 7. These plots help guide the user to opportunities for better mismatch, such as the sweet spot 210 shown on the right side of FIG. 7, that may otherwise not be apparent from single point solutions calculated in the mismatch tool 10.

Following the selection of the desired technology in the calculation setup frame 110, the user selects a create data entry input form 120 button. This selection causes the data input frame 130 to be generated.

Referring to FIG. 3, a data entry input frame 130 of the interface of FIG. 2 is shown. In an example of an embodiment of the present invention, an electronic circuit simulation model file name, it's revision number, and such other information as desired, is displayed at the top of the data entry input frame 130. The data entry input frame 130 further comprises geometry, bias and temperature condition selection parameters 132 for the selected technology and device. The specific geometry, bias and temperature condition parameters 132 that are generated following the selection of the create data entry input form 120 button are dependent upon the previous technology and device selections and therefore may vary. For example, the specific geometry, bias and temperature condition parameters 132 shown here in FIG. 3 result from the voltage driven scenario. However, additional or fewer fields may be generated for other scenarios, e.g. the current mirror and differential pair scenarios will also have a field, Np1, etc. to designate the number of devices placed in parallel. Those skilled in the art will be familiar with the bias and geometry condition parameters 132 displayed however. The user will next enter the desired bias, geometry and temperature values into the data entry fields reflecting the number of values desired for each parameter. The data entry fields are comprised of three columns: a single-value data entry column 126, a string-of-values data entry column 128, and range-of-value data entry column 138. Each of these data entry fields is utilized as follows. The single-value data entry column 126 accepts single values for each geometry, bias and temperature condition parameter. The string-of-values data entry column 128 accepts a delimited list of values for each geometry, bias and temperature condition parameter. The range-of-value data entry column 138 allow the user to input sweeps of geometry, bias and temperature condition parameters by specifying the start, stop, and step values.

In one embodiment, the desired values for each geometry, bias and temperature condition parameter may be entered into the single-value data entry column 126, the string-of-values data entry column 128, and the range-of-value data entry column 138 in any combination of the three columns. If multiple columns contain data entries for the same geometry, bias and temperature condition parameters, the calculation precedence is established from right to left (i.e. the range-of-value data entry column 138 supercedes the string-of-values data entry column 128 which in turn supercedes the single-value data entry column 126).

Figure 4:
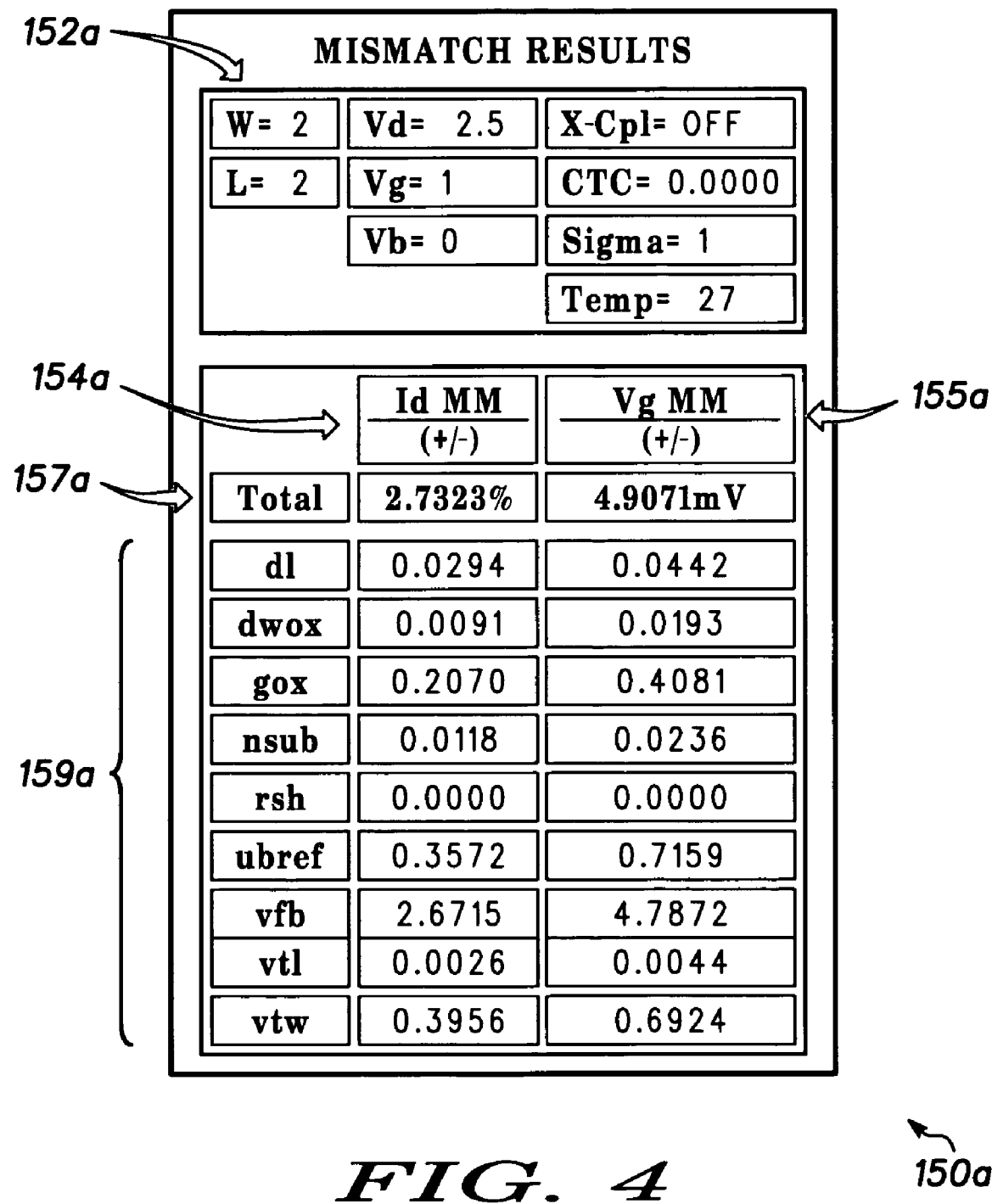
FIG. 4 is a mismatch results output frame of the interface shown in FIG. 2 for a voltage driven scenario.
Figure 5:
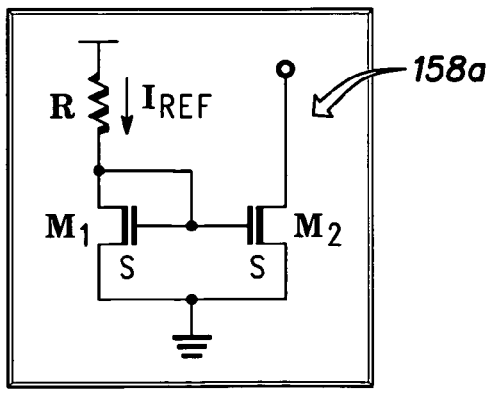
FIG. 5 is a mismatch results output frame of the interface shown in FIG. 2 for a current mirror scenario.
Figure 6:
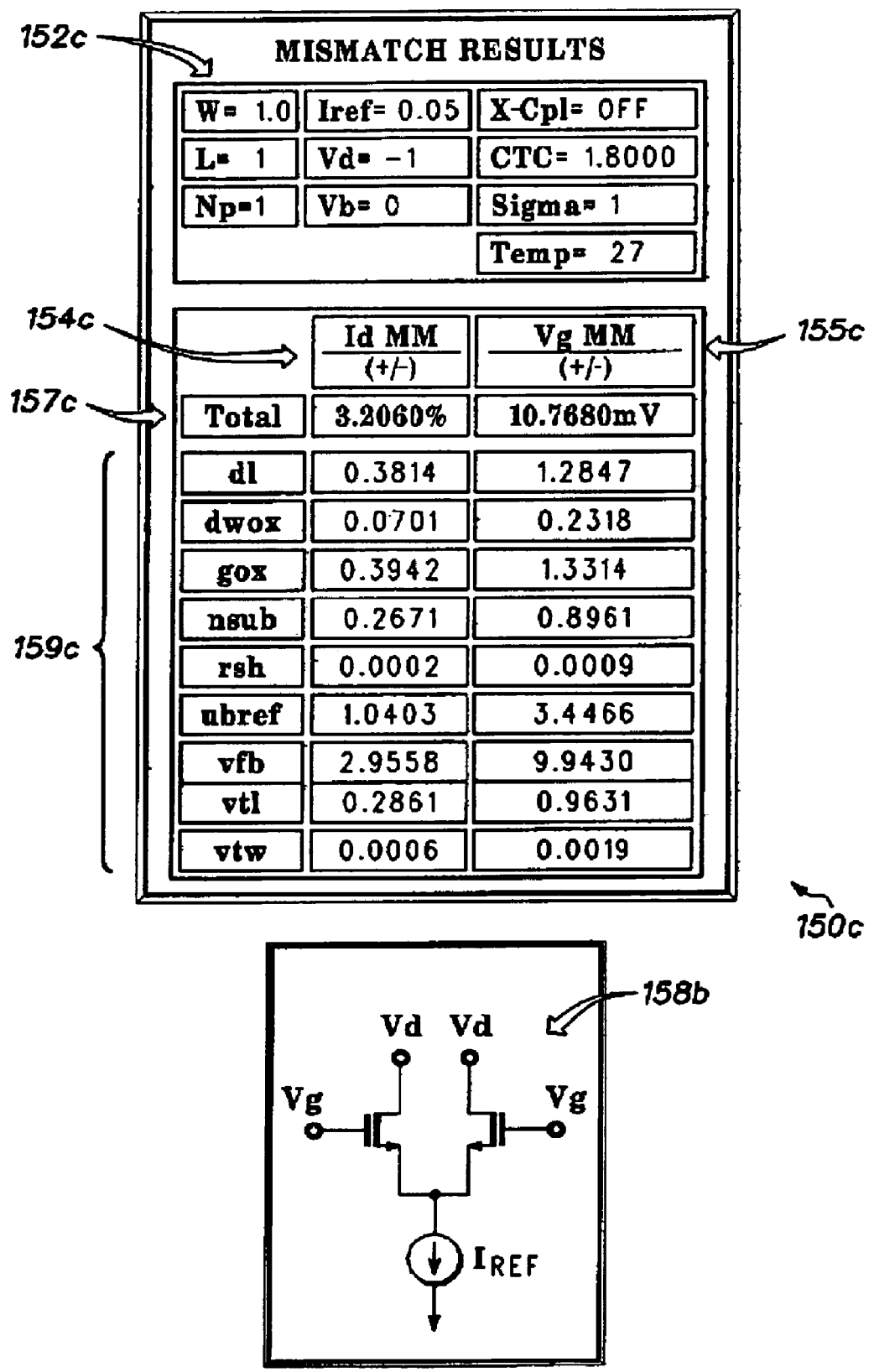
FIG. 6 is a mismatch results output frame of the interface shown in FIG. 2 for a differential pair scenario.

Additionally, if the data input frame 130 contains values only in the single-value data entry column 126, the output is directed to the data output frame 150 shown on the right side of FIG. 2, as well as in FIGS. 4–6. If either the string-ofvalues data entry column 128, or the range-of-value data entry column 138 contains data, the output will be placed in a delimited text file (such as is suitable for importing into spreadsheet or word processing programs) and the user receives the results following the completion of the calculations. This feature is present since many applications, including web browsers such as Netscape, will time-out before the mismatch calculator 10 can return the results from multiple calculations to the data output frame 150. Also, since the multiple calculations can require a period of time to run, this feature allows the user to continue with other tasks while the calculations are being run. The comma delimited text file data table can be used to generate mismatch plots such the one in FIG. 7, to build behavioral models, for use as a look-up table, to generate trend plots over bias, geometry or temperature, and to compare devices within and across technologies. FIG. 7 shows an example of a mismatch results three dimensional output plot showing a sweet spot 210 in a plot of Id versus geometry for an nmos current mirror.

An additional feature in an embodiment is that each of the parameter names, as well as any other desired label, may be hypertext linked to a short description or definition.

It should be noted that in an embodiment, the temperature condition parameter changes the operating temperature of the electronic circuit simulation package, such as SPICE, behind the mismatch tool 10 without the mismatch being measured and characterized over various temperatures. Changes in the temperature condition parameter will result in changes to the drain currents obtained from the SPICE simulation. In another embodiment of the present invention however, the mismatch may be measured and characterized over various temperatures.

An additional feature in an embodiment of the present invention is active error checking that automatically checks all bias and geometry condition parameter data entry values entered into the input columns: single-value data entry column 126, string-of-values data entry column 128, and/or range-of-value data entry column 138.

Below the input columns for geometry, bias and temperature, the user can choose to simulate the mismatch pair in a cross-couple configuration by entering appropriate data values into cross-coupled configuration data entry fields 134 that are comprised of fields for Center-to-center and Sigmas (#). A cross-coupled pair is distinguished from a common centroid pair in that not all cross-coupled pairs are common centroid. That is, the effective center of the first device needs to be coincident with the effective center of the second device to be considered a common centroid pair.

In an embodiment of the present invention the user may also optionally select to show mismatch process parameter contributions, show capacitances, and show VdSat by selecting the appropriate Show Parameter checkboxes 136.

During the course of entering the above data, the user may reset all the fields to their default values by clicking on a reset button 124.

Once the user has entered all of the desired data input values, they then press a Calculate button 122. All of the user data that has been input into the data entry input frame 130 is collected and combined with information to form a SPICE or Mica type netlist. The netlist is run on the computer 26 and the results are parsed out to several variables. The simulation results are combined with the mismatch model 30 coefficients to perform the mismatch calculations. A further feature of an embodiment of the present invention is the ability of the mismatch tool 10, using the mismatch model 30, to predict the mismatch standard deviation of a radially dependent gradient. Radially dependent gradients may result from spin-coat processes such as photoresist and developer deposition, or other single wafer process steps such as etch or material deposition. In the presence of radially dependant gradients, the matched pair of devices on one side of a wafer may have a positive gradient offset, while the matched pair on the opposite side of the wafer has a negative gradient offset. The overall measured distribution will still be centered about zero in the presence of the radial gradient, but the dispersion will bloom. Radial based gradients can be eliminated by using common centroid matched pairs. Thus, the mismatch tool 10 using the mismatch model 30, to predict the mismatch standard deviation of a radially dependent gradient is valid for common centroided pairs.

Referring again to FIG. 2, it will be recalled that the user is presented with the calculation type selection 118. This selection features five of the most popular types of calculation scenarios for MOSFET and BJT transistors, resistors and capacitors as follows:

Voltage Driven Scenario

The Voltage Driven scenario was developed primarily for characterization and technology development engineers. Referring to FIG. 4, the entries for the Voltage Driven configuration in the calculation type selection 118 comprise: Vd—drain voltage; Vg—gate voltage; Vb—bulk; W—Width; and L—Length as are shown in the entered data frame 152a.

Continuing with FIG. 4, a data output frame 150a is shown. The data output frame 150a contains two columns of data. The Id mismatch 154a, presented in the left column, is given as a percent difference between two devices. The right column contains the Vg mismatch 155a, which is the input offset voltage.

The first row of output data is the total Id and Vg mismatch 157a, given as a one-sigma standard deviation number, although this is user definable. The (+/−) notation indicates that the distribution is symmetric and that this offset number is for one side of the distribution. A total mismatch is computed from the individual process parameter contributions listed in the remaining rows of data parameters 159a comprised of: dl—offset in polysilicon gate length; dwox—offset in active region width; gox—gate oxide thickness; nsub—substrate dopant concentration; rsh—source and drain sheet resistances; ubref—reference mobility; vfb—flatband voltage; vtl—modification of vfb for short channel devices, and Vtw—accounts for changes in MOSFET narrow-width and inverse-narrow-width effects.

All process parameter contributions are given as one-sigma standard deviation numbers and these parameters are combined as a root-sum-of-squares to generate the total mismatch 157a (i.e. square each standard deviation to get a variance, add the variances, and square-root the total variance to the total standard deviation.) The user, by examining the data parameters 159a results that are presented in the data output frame 150a, will be able to determine the major contributors to the mismatch in a particular case. The user can then use this information to target those parameters that affect the mismatch.

Current Mirror Scenario

The Current Mirror mismatch scenario was developed primarily for analog and mixed-signal designers although many designers will find the mismatch tool 10 of value. The entries for the Current Mirror configuration entries into the calculation type selection 118 comprise: Vd—drain voltage; Vb—bulk; Iref—reference current; W—Width; and L—Length as are shown in the entered data frame 152b depicted in FIG. 5.

The Current Mirror scenario differs from the Voltage Driven scenario in that the user has the option of specifying the number of unit devices placed in parallel, Np1 and Np2, for both $M_1$ and $M_2$ through the use of an additional data entry field in the data input frame 130 (not shown in FIG. 2). This makes the mismatch tool 10 suitable for simulating the mismatch in the presence of ratioed mirrors. The variances across each of the unit devices, in a grouping of parallel devices, add to give the total variance. But, the overall sensitivity of the mirror to each unit device is reduced, thereby giving an overall reduction in mismatch when multiple devices are placed in parallel.

Referring to FIG. 5, a mismatch results output frame for a current mirror scenario assumes a particular circuit. As an aide to the user, the message frame 158 will display that circuit. Thus—message frame 158 shows a picture of the assumed circuit 158a.

An example mismatch tool 10 output frame 150b depicted in FIG. 5, contains two columns of data, the Total mismatch 154b, and the mismatch without the output conductance, go, on $M_2$, w/o go on M2 155b. In the latter case, w/o go on M2 155b, the mismatch simulation is performed with the drain of $M_1$ tied to the gate of $M_2$. In this manner, the mismatch results can be added to a SPICE TYPE circuit netlist without double counting the effect of the output conductance on $M_2$.

A total mismatch 157b is computed from the individual process parameter contributions listed in the remaining rows of data parameters 159b comprised of: dl—offset in polysilicon gate length; dwox—offset in active region width; gox—gate oxide thickness; nl—substrate dopant concentration; rsh—source and drain sheet resistances; ubref—reference mobility; vfb—flatband voltage; and vtl—modification of Vfb for short channel devices.

As in the voltage driven scenario, all process parameter contributions are given as one-sigma standard deviation numbers, that may be user defined to other than one-sigma, and these parameters are combined as a root-sum-of-squares to generate the total mismatch 157b. The user, by examining the data parameters 159b results that are presented in the data output frame 150b, will be able to determine the major contributors to the mismatch in a particular case. The user can then use this information to target those parameters that affect the mismatch.

Since Current Mirrors are often operated over a range of current, the mismatch can change dramatically over the operating region of the matched pair (approximately 5× in this case). The mismatch tool 10 allows the user to sweep the bias conditions to check the mismatch over the anticipated operating region.

Note that Vg mismatch is not provided for the Current Mirror case since the gates of $M_1$ and $M_2$ are tied together and cannot be offset. For this requirement, the current driven, Differential Pair scenario is suggested.

Differential Pair Scenario

The Differential Pair scenario depicted in FIG. 6 was also developed primarily for analog and mixed-signal designers although again many designers will find the mismatch tool 10 of value. The Differential Pair scenario is nearly identical to the Voltage Driven scenario with the exception that the MOSFET matched pair is current driven. The entries for the Differential Pair configuration entries into the calculation type selection 118 comprise: Iref—reference current (Iref for the Differential Pair is the current for both branches; Data Entered into interface for p-type must be entered as a negative i.e. −10u); Vd—drain voltage; Vb—bulk; W—Width; and L—Length as are shown in the entered data frame 152c. An additional data entry field in the data input frame 130 (not shown in FIG. 2) allows the user to change the number of devices placed in parallel which is required to be the same for both the left and right devices.

Referring to FIG. 6, a differential pair scenario assumes a particular circuit. As an aide to the user, the message frame 158 will display that circuit. Thus—message frame 158 shows a picture of the assumed circuit 158b.

Referring further to FIG. 6, the data output frame 150c is shown. The data output frame 150c contains two columns of data. The Id mismatch 154c, presented in the left column, is given as a percent difference between two devices. The right column contains the Vg mismatch 155c, which is the input offset voltage.

The first row of output data is the total Id and Vg mismatch 157c, again, given as a one-sigma standard deviation number that may be user defined to other than one-sigma. The (+/−) notation indicates that the distribution is symmetric and that this offset number is for one side of the distribution. A total mismatch is computed from the individual process parameter contributions listed in the remaining rows of data parameters 159c comprised of: dl—offset in polysilicon gate length; dwox—offset in active region width; gox—gate oxide thickness; nsub—substrate dopant concentration; rsh—source and drain sheet resistances; ubref—reference mobility; vfb—flatband voltage; vtl—modification of Vfb for short channel devices, and Vtw—accounts for changes in MOSFET narrow-width and inverse-narrow-width effects.

The user, by examining the data parameters 159c results that are presented in the data output frame 150c, will be able to determine the major contributors to the mismatch in a particular case. The user can then use this information to target those parameters that affect the mismatch.

Referring to FIG. 7, an example of a mismatch results three dimensional output plot showing a sweet spot in a plot of Id versus geometry for an nmos current mirror ("output plot 200" hereinafter) is shown. The example output plot 200 shows the results of a spread or range of calculations such as would have been input into the string-of-values data entry column 128 or the range-of-value data entry column 138. Thus—the user when presented with an output plot 200 as shown can immediately discern the sweet spot 210.

Mismatch variance is not the only design objective for a matched pair of devices. Thus—an embodiment of the present invention has as further features the addition of several parameter calculations to the mismatch tool 10 to allow simultaneous monitoring of multiple criteria. With every circuit configuration, as previously discussed, the nominal Id is provided. For the Current Mirror and the Differential Pair scenarios of FIGS. 5 and 6, the nominal Vg, is provided and the Current Mirror scenario output reports Id/I ref.

Resistor Scenario

Referring to FIG. 8, an interface screen showing the data entry input frame and mismatch results output frame for a resistor mismatch calculation scenario is shown. The interface screen 100, as previously discussed, comprises a calculation setup frame 10, a data input frame 130, a data output frame 150, and a message frame 158. In the resistor calculation scenario in an embodiment of the present invention, the user will select a device type selection 114 designating a resistor (abbreviated "RES" in FIG. 8). Following completion of the selections of the desired technology and the create data entry input form 120 button in the calculation setup frame 10, the data input frame 130 is generated.

The data entry input frame 130 comprises length and width selection parameters 132. The specific length and width parameters 132 that are generated following the selection of the create data entry input form 120 button are dependent upon the previous technology and device selections and therefore may vary. As previously discussed, the desired values for the width and length parameters may be entered into the single-value data entry column 126, the string-of-values data entry column 128, and the range-of-value data entry column 138 in any combination of the three columns. And as before, if multiple columns contain data entries for the same width and length parameters, the calculation precedence is established from right to left (i.e. the range-of-value data entry column 138 supercedes the string-of-values data entry column 128 which in turn supercedes the single-value data entry column 126).

Below the input columns for width and length, the user can choose to simulate the mismatch pair in a cross-couple configuration by entering appropriate data values into cross-coupled configuration data entry fields 134 that are comprised of fields for Center-to-center and Sigmas(#). It should be noted that the process for computing the mismatch is a little different for the resistor scenario than that of the transistor scenarios. The primary difference is that a SPICE or MCSPICE type program is not utilized as the calculation is much simpler. Instead, a parameter file is used for the measured data terms.

An additional difference is the equation for computing the mismatch. The computational code for this mismatch calculation is: $(\sigma_C^2/C^2)=(\sigma_L^2/L^2)+(\sigma_W^2/W^2)+(\sigma_{LW}^2/LW)+(g*ctc^2)$.

Following the calculation of the resistor scenario, if the data input frame 130 contains values only in the single-value data entry column 126, the output is directed to the data output frame 150. And as previously discussed, if either the string-of-values data entry column 128, or the range-of-value data entry column 138 contains data, the output will be placed in a delimited text file (such as is suitable for importing into spreadsheet or word processing programs) and the user receives the results following the completion of the calculations.

The data output frame 150*d* contains one column of data showing the percent difference between devices given as a one-sigma standard deviation number, although this is user definable. All process parameter contributions are given as one-sigma standard deviation numbers and these parameters are combined as a root-sum-of-squares to generate the total mismatch 162. As before, the (+/−) notation indicates that the distribution is symmetric and that this offset number is for one side of the distribution.

Capacitor Scenario

Referring to FIG. 9, an interface screen showing the data entry input frame and mismatch results output frame for a capacitor mismatch calculation scenario is shown. The interface screen 100, as previously discussed, comprises a calculation setup frame 110, a data input frame 130, a data output frame 150, and a message frame 158. In the capacitor calculation scenario embodiment, the user will select a device type selection 114 designating a capacitor (abbreviated "CAP" in FIG. 9). Following completion of the selections of the desired technology and the create data entry input form 120 button in the calculation setup frame 110, the data input frame 130 is generated.

The data entry input frame 130 comprises length and width selection parameters 132. The specific length and width parameters 132 that are generated following the selection of the create data entry input form 120 button are dependent upon the previous technology and device selections and therefore may vary. As previously discussed, the desired values for the width and length parameters may be entered into the single-value data entry column 126, the string-of-values data entry column 128, and the range-of-value data entry column 138 in any combination of the three columns. And as before, if multiple columns contain data entries for the same width and length parameters, the calculation precedence is established from right to left (i.e. the range-of-value data entry column 138 supercedes the string-of-values data entry column 128 which in turn supercedes the single-value data entry column 126).

Below the input columns for width and length, the user can choose to simulate the mismatch pair in a cross-couple configuration by entering appropriate data values into cross-coupled configuration data entry fields 134 that are comprised of fields for Center-to-center and Sigmas(#). It should be noted that the process for computing the mismatch is a little different for the capacitor scenario than that of the transistor scenarios. The primary difference is that a SPICE or MCSPICE type program is not utilized as the calculation is much simpler. Instead, a parameter file is used for the measured data terms.

An additional difference is the equation for computing the mismatch. The computational code for this mismatch calculation is:

$$(\sigma_C^2/C^2)=(\sigma_L^2/L^2)+(\sigma_W^2/W^2)+(\sigma_{LW}^2/LW)+(g*ctc^2).$$

Following the calculation of the capacitor scenario, if the data input frame 130 contains values only in the single-value data entry column 126, the output is directed to the data output frame 150. And as previously discussed, if either the string-of-values data entry column 128, or the range-of-value data entry column 138 contains data, the output will be placed in a delimited text file (such as is suitable for importing into spreadsheet or word processing programs) and the user receives the results following the completion of the calculations.

The data output frame 150*e* contains one column of data showing the percent difference between devices given as a one-sigma standard deviation number, although this is user definable. All process parameter contributions are given as one-sigma standard deviation numbers and these parameters are combined as a root-sum-of-squares to generate the total mismatch 162. As before, the (+/−) notation indicates that the distribution is symmetric and that this offset number is for one side of the distribution.

While the invention has been particularly shown and described with reference to the embodiments thereof, it will be understood by those skilled in the art that the foregoing and other changes in form, and details may be made therein without departing from the spirit and scope of the invention.

What is claimed is:

1. A mismatch modeling tool comprising:
   a software implemented transistor mismatch model ("SITMM");
   at least one editable mismatch model data library comprising process parameter variables accessed by said SITMM;
   a circuit simulation library and program data output accessed by said SITMM; and
   a graphical interface to said SITMM, the graphical interface having: (a) a plurality of string-of-data input parameter fields to provide a plurality of input parameter data strings to the SITMM for generating results for at least one mismatch parameter over the plurality of input parameter data strings, wherein each of the string-of-data input parameter fields accepts a delimited list of values for each geometry, bias, and temperature condition parameter, and (b) a plurality of range-of-data input parameter fields to provide a plurality of input parameter ranges of data to the SITMM for generating results for at least one mismatch parameter over the plurality of input parameter ranges of data, wherein the mismatch modeling tool is configured for utilization via a web interface.

2. The mismatch modeling tool of claim 1 wherein said graphical interface comprises a menu driven modeled device selection frame.

3. The mismatch modeling tool of claim 2 wherein said menu driven modeled device selection frame configures said software implemented transistor mismatch model to display a dynamically generated input data frame within said graphical interface.

4. The mismatch modeling tool of claim 3 wherein said dynamically generated input data frame reflects data input fields of one of a plurality of input scenarios comprising at least one of:
   a voltage driven scenario;
   a current mirror scenario;
   a differential pair scenario;
   a resistor scenario; and
   a capacitor scenario.

5. The mismatch modeling tool of claim 4 wherein said dynamically generated input data frame comprises a plurality of data input columns comprised of at least two of:
   a plurality of single-data input parameter fields;
   the plurality of string-of-data input parameter fields; and
   the plurality of range-of-data input parameter fields.

6. The mismatch modeling tool of claim 5 further comprising an electronically transmitted ASCII output data file, said ASCII output data file comprising output data reflecting at least one of said at least two of:
   said plurality of single-data input parameter fields;
   said plurality of string-of-data input parameter fields; and
   said plurality of range-of-data input parameter fields.

7. The mismatch modeling tool of claim 6 wherein said ASCII output data file is an emailed ASCII output data file.

8. The mismatch modeling tool of claim 6 further comprising a three dimensional output plot, said three dimensional output plot being a graphical representation of said output data within said ASCII output data file.

9. The mismatch modeling tool of claim 5 further comprising
   when the plurality of data input columns includes the plurality of single-data input parameter fields, a dynamically generated output data frame, said dynamically generated output data frame displaying output data reflecting said plurality of single-data input parameter fields.

10. A mismatch modeling tool comprising:
    a software implemented transistor Mismatch model ("SITMM");
    at least one editable mismatch model data library comprising process parameter variables accessed by said SITMM;
    a circuit simulation library and program data output accessed by said SITMM; and
    a graphical interface to said SITMM, the graphical interface having a plurality of fields for receiving sets of mismatch input data for a plurality of mismatch input parameters and providing the sets of mismatch input data to the SITMM to generate mismatch output data based on the sets of mismatch input data,
    wherein each of the plurality of fields accepts a delimited list of values for geometry, bias, and temperature condition parameters, and
    wherein the mismatch modeling tool is configured for utilization via a web interface.

11. The mismatch modeling tool of claim 10 wherein said software implemented transistor mismatch model is configurable for a plurality of input scenarios comprising at least one of:
    a voltage driven scenario;
    a current mirror scenario;
    a differential pair scenario;
    a resistor scenario; and
    a capacitor scenario.

12. The mismatch modeling tool of claim 11 wherein said graphical interface comprises a dynamically generated input data frame, said dynamically generated input data frame displaying parameters reflecting a selected said input scenario.

13. The mismatch modeling tool of claim 12 wherein said dynamically generated input data frame comprises a plurality of data input columns comprised of at least two of:
    a plurality of single-data input parameter fields;
    a plurality of string-of-data input parameter fields; and
    a plurality of range-of-data input parameter fields.

14. The mismatch modeling tool of claim 13 further comprising:
    when the plurality of data input columns includes the plurality of single-data input parameter fields, a dynamically generated output data frame, said dynamically generated output data frame displaying output data reflecting said plurality of single-data input parameter fields.

15. The mismatch modeling tool of claim 13 further comprising an electronically transmitted ASCII output data file, said ASCII output data file comprising output data reflecting at least one of said at least two of:
    said plurality of single-data input parameter fields;
    said plurality of string-of-data input parameter fields; and
    said plurality of range-of-data input parameter fields.

16. The mismatch modeling tool of claim 15 further comprising a three dimensional output plot, said three dimensional output plot being a graphical representation of said output data within said ASCII output data file.

17. The mismatch modeling tool of claim 12 wherein said dynamically generated input data frame comprises a plurality of data input columns comprised of at least one of:
    a plurality of string-of-data input parameter fields; and
    a plurality of range-of-data input parameter fields.

18. The mismatch modeling tool of claim 17 further comprising an ASCII output data file, said ASCII output data file comprising output data reflecting said at least one of:
    said plurality of string-of-data input parameter fields; and
    said plurality of range-of-data input parameter fields.

19. The mismatch modeling tool of claim 18 further comprising a three dimensional output plot, said three dimensional output plot being a graphical representation of said output data within said ASCII output data file.

* * * * *